(12) United States Patent
Rishin

(10) Patent No.: US 6,850,105 B1
(45) Date of Patent: Feb. 1, 2005

(54) METHOD AND CIRCUITRY FOR PRESERVING A LOGIC STATE

(75) Inventor: Dror Rishin, Beney-Yehuda Ramat Hagolan (IL)

(73) Assignee: StarCore, LLC, Austin, TX (US)

( * ) Notice: Subject to any disclaimer, the term of this patent is extended or adjusted under 35 U.S.C. 154(b) by 0 days.

(21) Appl. No.: 10/675,397

(22) Filed: Sep. 30, 2003

(51) Int. Cl.[7] .................. H03K 3/289; H03K 3/356; H03K 3/12
(52) U.S. Cl. .................. 327/202; 327/203; 327/218
(58) Field of Search .................. 327/199, 200, 327/201, 202, 203, 208–212, 218

(56) References Cited

U.S. PATENT DOCUMENTS

| | | | |
|---|---|---|---|
| 4,324,252 A | 4/1982 | Rossing et al. ............... 607/9 |
| 5,250,852 A | 10/1993 | Ovens et al. ............... 327/202 |
| 5,283,582 A | 2/1994 | Krenik ............... 341/158 |
| 5,350,407 A | 9/1994 | McClure et al. ............... 617/16 |
| 5,408,138 A | * | 4/1995 | Khosravi et al. ............... 327/203 |
| 5,473,571 A | 12/1995 | Shigematsu et al. ............... 365/227 |
| 5,587,672 A | 12/1996 | Ranganathan et al. ............... 326/93 |
| 6,166,990 A | 12/2000 | Ooishi et al. ............... 365/233 |
| 6,256,252 B1 | 7/2001 | Arimoto ............... 365/227 |
| 6,487,136 B2 | 11/2002 | Hidaka ............... 365/222 |
| 6,515,913 B2 | 2/2003 | Kajigaya et al. ............... 365/189.09 |
| 2002/0008999 A1 | 1/2002 | Hidaka ............... 365/200 |
| 2002/0080663 A1 | 6/2002 | Kameyama et al. ............... 365/200 |
| 2002/0105845 A1 | 8/2002 | Hidaka ............... 365/222 |
| 2003/0031058 A1 | 2/2003 | Kajigaya et al. ............... 365/189.09 |
| 2003/0141911 A1 | * | 7/2003 | Steiss et al. |

FOREIGN PATENT DOCUMENTS

| | | | |
|---|---|---|---|
| DE | 3443788 | * | 6/1986 |
| EP | 0255362 A2 | | 2/1988 |
| EP | 0896421 A2 | | 2/1999 |
| EP | 1100089 A1 | | 5/2001 |
| JP | 6-45879 | * | 2/1994 |

* cited by examiner

*Primary Examiner*—Tuan T. Lam
(74) *Attorney, Agent, or Firm*—Michael A. Davis, Jr.; Haynes and Boone, LLP

(57) ABSTRACT

In response to a first transition of a clock signal, an information signal having a logic state is received. In response to a second transition of the clock signal, first circuitry latches a logic state of a first signal that indicates the information signal's logic state. In response to a third transition of the clock signal, second circuitry latches a logic state of a second signal that indicates the first signal's logic state. During a first mode of operation, power is supplied to the first and second circuitry. During a second mode of operation, power is reduced to the first circuitry, while power is supplied to the second circuitry, so that the first signal's logic state is lost, while the second signal's logic state is preserved.

25 Claims, 2 Drawing Sheets

METHOD AND CIRCUITRY FOR PRESERVING A LOGIC STATE

BACKGROUND

The disclosures herein relate generally to information handling systems and in particular to a method and circuitry for preserving a logic state.

In circuitry for selectively latching a logic state (e.g., binary zero or one), it is desirable to reduce power consumption, especially during inactive periods (e.g., when the logic state is static). With a previous technique for reducing power consumption, a shortcoming is that the circuitry's performance (e.g., speed) is reduced during periods of active operation. With another previous technique, the circuitry's performance is maintained during periods of active operation, but the logic state is either: (a) not preserved during an inactive period; or (b) preserved during an inactive period in a manner that involves an inefficient reset process for restoring the logic state during a subsequent period of active operation.

A need has arisen for a method and circuitry for preserving a logic state, in which various shortcomings of previous techniques are overcome. For example, a need has arisen for a method and circuitry for preserving a logic state, in which power consumption is reduced while preserving a logic state.

SUMMARY

According to one embodiment, in response to a first transition of a clock signal, an information signal having a logic state is received. In response to a second transition of the clock signal, first circuitry latches a logic state of a first signal that indicates the information signal's logic state. In response to a third transition of the clock signal, second circuitry latches a logic state of a second signal that indicates the first signal's logic state. During a first mode of operation, power is supplied to the first and second circuitry. During a second mode of operation, power is reduced to the first circuitry, while power is supplied to the second circuitry, so that the first signal's logic state is lost, while the second signal's logic state is preserved.

A principal advantage of this embodiment is that various shortcomings of previous techniques are overcome, and power consumption is reduced while preserving a logic state.

DETAILED DESCRIPTION

Figure 1:
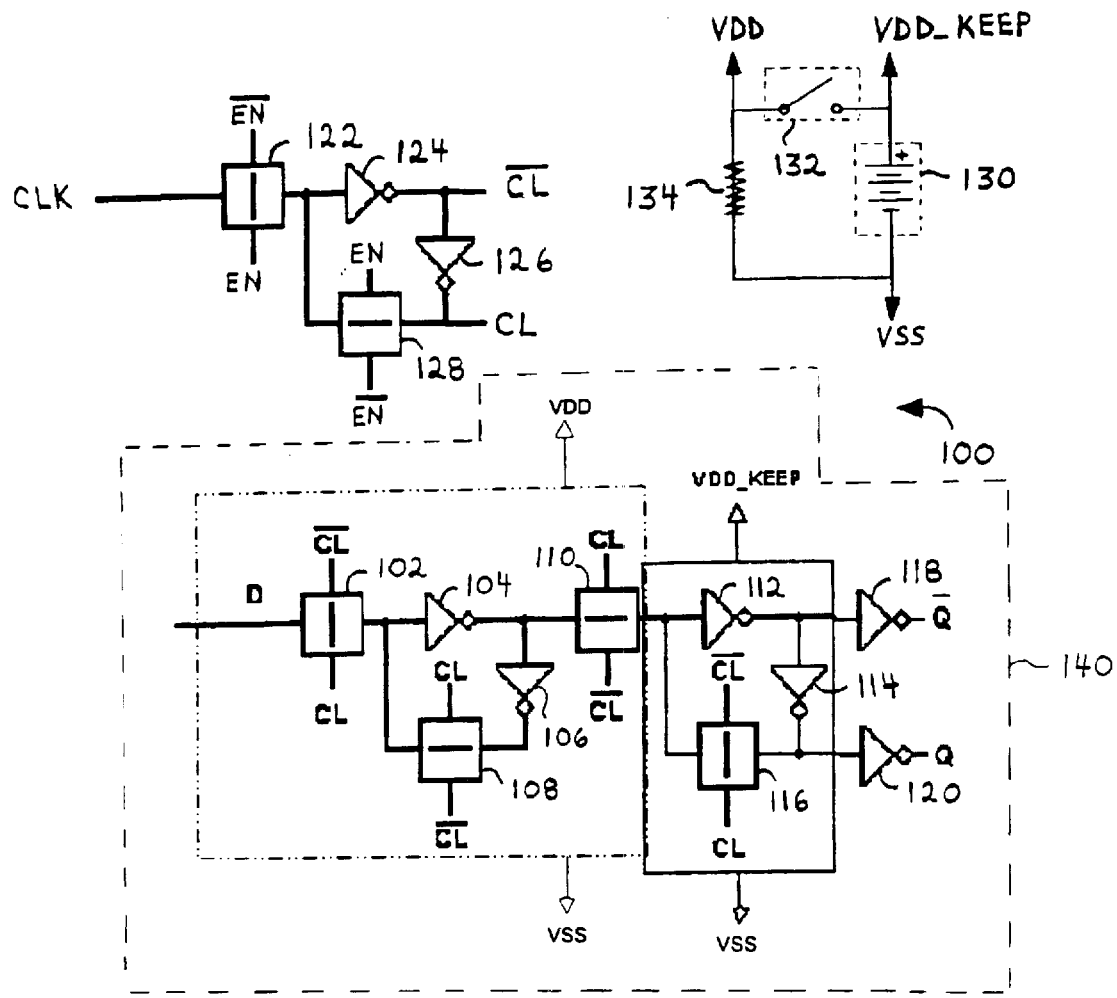
FIG. 1 is a schematic electrical circuit diagram of circuitry for preserving a logic state, according to the illustrative embodiment.

FIG. 1 is a schematic electrical circuit diagram of circuitry (indicated generally at 100) for latching a logic state, according to the illustrative embodiment. The circuitry 100 includes a D flip-flop, which receives a binary information input signal D and outputs binary information output signals Q and $\overline{Q}$.

In FIG. 1, an input node of a transfer gate 102 is connected to D, and an output node of the transfer gate 102 is connected to an input node of an inverter 104. An output node of the inverter 104 is connected to an input node of an inverter 106. An output node of the inverter 106 is connected to an input node of a transfer gate 108. An output node of the transfer gate 108 is connected to the input node of the inverter 104.

An input node of a transfer gate 10 is connected to the output node of the inverter 104, and an output node of the transfer gate 10 is connected to an input node of an inverter 112. An output node of the inverter 112 is connected to an input node of an inverter 114. An output node of the inverter 114 is connected to an input node of a transfer gate 116. An output node of the transfer gate 116 is connected to the input node of the inverter 12.

Also, the output node of the inverter 112 is connected to an input node of an inverter 118. The output node of the inverter 114 is connected to an input node of an inverter 120. An output node of the inverter 118 is connected to $\overline{Q}$, and an output node of the inverter 120 is connected to Q.

An input node of a transfer gate 122 is connected to receive a clock signal CLK, and an output node of the transfer gate 122 is connected to an input node of an inverter 124. An output node of the inverter 124 is connected to output an inverted clock signal $\overline{CL}$ and to an input node of an inverter 126. An output node of the inverter 126 is connected to output a clock signal CL and to an input node of a transfer gate 128. An output node of the transfer gate 128 is connected to the input node of the inverter 124.

Each of the transfer gates 122 and 128 is a complementary metal oxide semiconductor ("CMOS") transfer gate, connected to receive an enable signal EN and to receive an inverted enable signal $\overline{EN}$. Each of the transfer gates 102, 108, 110 and 116 is a CMOS transfer gate, connected to CL and to $\overline{CL}$. Each of the inverters 104, 106, 112, 114, 118, 120, 124 and 126 is a CMOS inverter. The transfer gates 102, 108 and 110, and the inverters 104, 106, 118 and 120 are connected to a voltage supply node VDD and a voltage reference node VSS, so that power is supplied to such transfer gates and inverters (which receive such power) during first and second modes of operation as discussed hereinbelow. The transfer gates 116, 122 and 128, and the inverters 112, 114, 124 and 126 are connected to a voltage supply node VDD_KEEP and the voltage reference node VSS, so that power is supplied to such transfer gates and inverters (which receive such power) during the first mode of operation as discussed hereinbelow.

A first node of a direct current ("DC") power supply 130 is connected to VDD_KEEP. Also, the first node of the power supply 130 is coupled through a switch 132 to VDD. A second node of the power supply 130 is connected to VSS. Also, the second node of the power supply 130 is coupled through a resistor 134 to VDD.

In a first mode of operation, EN is high (e.g., has a "high" binary logic state of one, which is approximately 3.5 volts relative to VSS), and $\overline{EN}$ is low (e.g., has a "low" binary logic state of zero, which is approximately 0 volts relative to VSS), so that: (a) the transfer gate 122 closes, and the transfer gate 128 opens; (b) from the output node of the transfer gate 122, the inverter 124 receives a clock signal having CLK's logic state; (c) the inverter 124 outputs $\overline{CL}$ having a logic state inverted from CLK's logic state; and (d) the inverter 126 outputs CL having a logic state equal to CLK's logic state (i.e., inverted from $\overline{CL}$'s logic state).

Preferably, CLK has an approximately 50% duty cycle, such that the time during which CLK is high, is approximately equal to the time during which CLK is low. Also, in the first mode of operation, the switch 132 is closed, so that VDD is connected (or coupled) to VDD_KEEP and accordingly has a voltage equal to VDD_KEEP's voltage, which supplies (e.g., connects, couples, or effectively enables) power to the transfer gates 102, 108 and 110, and to the inverters 104, 106, 118 and 120.

In a second mode of operation, while CL is high and $\overline{CL}$ is low, EN is switched low, and $\overline{EN}$ is switched high, so that: (a) the transfer gate 122 opens, and the transfer gate 128 closes; (b) the logic states of CL (high) and $\overline{CL}$ (low) are latched by the back-to-back inverters 124 and 126, so that the transfer gate 116 is latched closed. Also, in the second mode of operation, the switch 132 is switched open in delayed response to EN being low (and/or in response to $\overline{EN}$ being high), so that VDD is disconnected (or decoupled) from VDD_KEEP and accordingly has a high impedance, which substantially reduces (e.g., disconnects, decouples, or effectively disables) power to the transfer gates 102, 108 and 110, and to the inverters 104, 106, 118 and 120.

Unless otherwise noted, the following discussion refers to operation of the circuitry 100 in the first mode. In response to an active edge transition of CLK, Q assumes a logic state equal to an earlier logic state of D, and $\overline{Q}$ rapidly assumes a logic state inverted from Q. If the logic state of D later changes, then Q assumes a logic state equal to the changed logic state of D, but only in response to a subsequent active edge of CLK, and $\overline{Q}$ rapidly assumes a logic state inverted from Q.

In response to a positive edge transition of CL (and the corresponding negative edge transition of $\overline{CL}$), which occurs at a start of a particular cycle of CLK: (a) the transfer gates 102 and 116 close, and the transfer gates 108 and 110 open; (b) from the output node of the transfer gate 102, the inverter 104 receives an information signal having D's logic state; (c) the inverter 104 outputs a signal having a logic state inverted from D's logic state; and (d) logic states of Q and $\overline{Q}$ are latched by the back-to-back inverters 112 and 114.

In response to a subsequent negative edge transition of CL (and the corresponding positive edge transition of $\overline{CL}$), which occurs between the start and an end of the particular cycle of CLK: (a) the transfer gates 102 and 116 open, and the transfer gates 108 and 110 close; (b) the logic state of the signal output by the inverter 104 is latched by the back-to-back inverters 104 and 106; (c) from the output node of the transfer gate 110, the inverter 112 receives such signal (output by the inverter 104); and (d) the inverter 112 outputs a signal having a logic state inverted such the latched logic state. Such logic states indicate D's logic state as it existed immediately before such negative edge transition of CL (and the corresponding positive edge transition of $\overline{CL}$).

In response to a subsequent positive edge transition of CL (and the corresponding negative edge transition of $\overline{CL}$), which occurs at the end of the particular cycle of CLK: (a) the transfer gates 102 and 116 close, and the transfer gates 108 and 110 open; and (b) the logic state of the signal output by the inverter 112 is latched by the back-to-back inverters 112 and 114. The logic state of Q is the same as such latched logic state. The logic state of $\overline{Q}$ is inverted from Q's logic state. Accordingly, such logic states indicate the logic state of the signal output by the inverter 104 as it existed immediately before such positive edge transition of CL (and the corresponding negative edge transition of $\overline{CL}$). Also, in response to such positive edge transition of CL (and the corresponding negative edge transition of $\overline{CL}$): (a) from the output node of the transfer gate 102, the inverter 104 receives the information signal having D's logic state; and (b) the inverter 104 outputs a signal having a logic state inverted from D's logic state.

Advantageously, during operation of the circuitry 100 in the second mode, power consumption is reduced, while the then-currently latched logic states of respective signals output by the inverters 112 and 114 are preserved. Specifically, during the second mode: (a) power consumption is reduced, because VDD has a high impedance, and accordingly the transfer gates 102, 108 and 110, and the inverters 104, 106, 118 and 120 (which, during the first mode, receive power from VDD and VSS) have a high impedance; and (b) logic states of respective signals output by such transfer gates and inverters are lost.

By comparison, during the second mode, the then-currently latched logic states of respective signals output by the inverters 112 and 114 are preserved by the circuitry 100, because the transfer gates 116, 122 and 128, and the inverters 112, 114, 124 and 126 (which, during the first mode, receive power from VDD_KEEP and VSS) continue receiving such power (which continues being supplied to such transfer gates and inverters). By preserving such logic states during the second mode, the circuitry 100 is prepared for a more efficient return to the first mode of operation, without performing an inefficient reset process for restoring the logic states of Q and $\overline{Q}$ after such return. Upon such return, $\overline{Q}$ rapidly assumes a logic state that is inverted from the then-current logic state of the signal output by the inverter 112, and Q rapidly assumes a logic state that is inverted from the then-current logic state of the signal output by the inverter 114.

Figure 2:
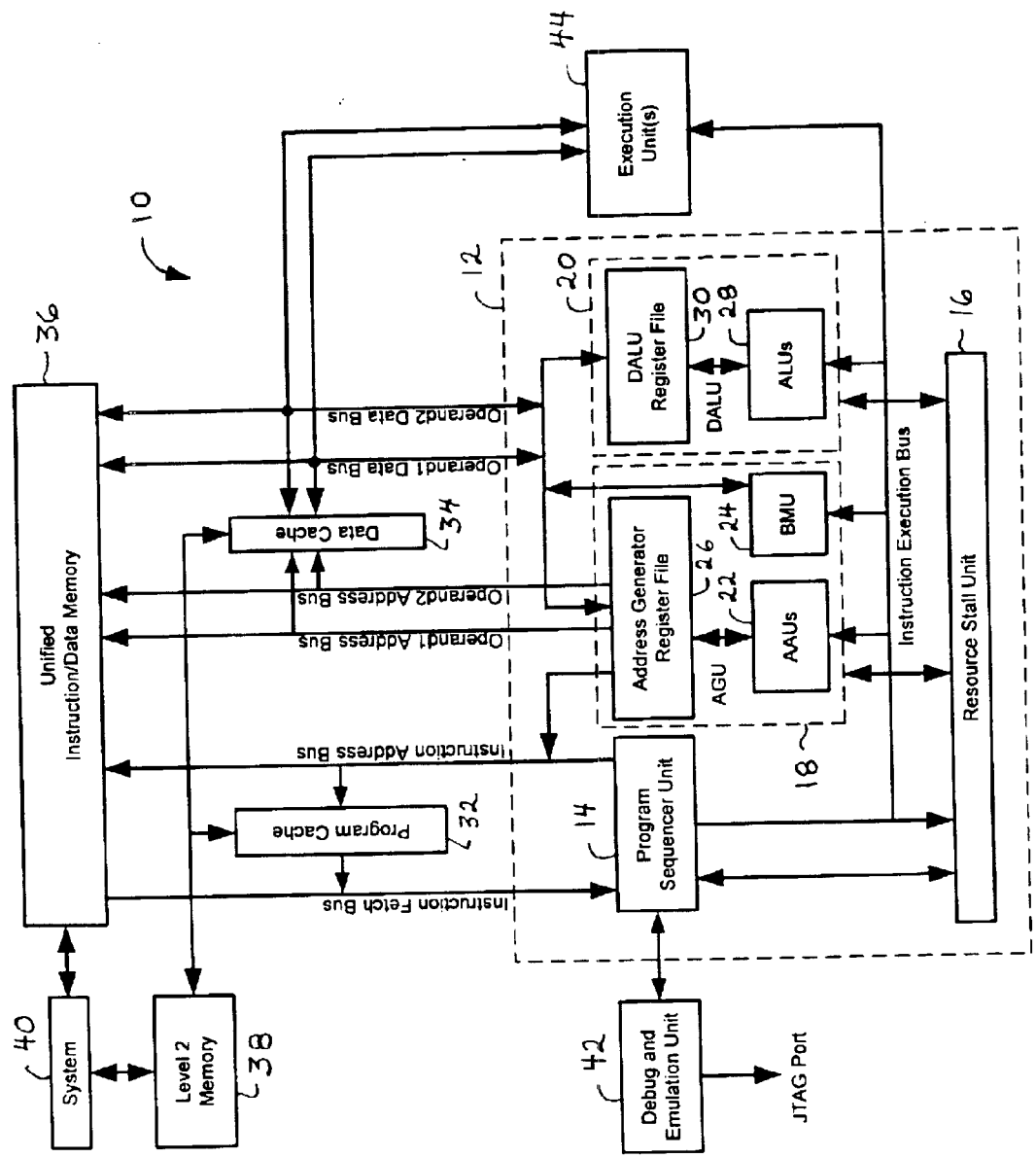
FIG. 2 is a block diagram of an example system that includes the circuitry of FIG. 1, according to the illustrative embodiment.

FIG. 2 is a block diagram of an example system, indicated generally at 10, for handling information (e.g., instructions, data, signals), according to the illustrative embodiment. In the illustrative embodiment, the system 10 is formed by various electronic circuitry components. Accordingly, the system 10 includes various units, registers, buffers, memories, and other components, which are (a) coupled to one another through buses, (b) formed by integrated circuitry in one or more semiconductor chips, and (c) encapsulated in one or more packages.

Referring also to FIG. 1, the D flip-flop (indicated by dashed enclosure 140) of circuitry 100 includes the transfer gates 102, 108, 110 and 116, plus the inverters 104, 106, 112, 114, 118 and 120. The D flip-flop 140 is a representative one of numerous substantially identical D flip-flops in the system 10. Such flip-flops are divided into various groups, according to a respective component or sub-component (of the system 10) that includes a group's flip-flops. Accordingly, in the illustrative embodiment, if a component of the system 10 is shown in FIG. 2 (or described hereinbelow in connection with FIG. 2), such component includes at least one respective group of such flip-flops.

During active operation of a group's component (or sub-component), the group's flip-flops operate in the first mode. Conversely, if the group's component (or sub-component) is inactive during a period (e.g., if its logic state is then-currently static), the system 10 switches the group's flip-flops to operate in the second mode during such period, in order to reduce (or conserve) power. Accordingly, for all components of the system 10 that are shown in FIG. 2, the system 10 includes circuitry (e.g., in such components themselves) for: (a) determining whether such components (and/or their sub-components) are then-currently active or inactive, and outputting respective activity signals (on a component-by-component basis, or sub-component by sub-component basis) in response thereto; and (b) in response to the activity signals, selecting (e.g., selectively switching) between such first and second modes on a group-by-group basis, according to whether a group's component (and/or sub-component) is then-currently active. For example, U.S. Pat. No. 5,420,808 (which is hereby incorporated by reference in its entirety) describes techniques for an integrated circuit to determine whether its various components (and sub-components) are then-currently active or inactive.

As shown in FIG. 2, the system 10 includes a core unit, indicated by a dashed enclosure 12, for performing various operations as discussed hereinbelow in connection with FIG. 1. The core unit 12 includes: (a) a program sequencer unit 14; (b) a resource stall unit 16; (c) an address generation unit ("AGU"), indicated by a dashed enclosure 18; and (d) a data arithmetic logic unit ("DALU"), indicated by a dashed enclosure 20. The AGU includes arithmetic address units ("AAUs") 22, a bit mask unit ("BMU") 24, and an address generator register file 26. The DALU includes arithmetic logic units ("ALUs") 28 and a DALU register file 30. The program sequencer unit 14, resource stall unit 16, AGU 18 (including its various units and files), and DALU 20 (including its various units and files) are interconnected as shown in FIG. 2.

Further, as shown in FIG. 2, the core unit 12 is connected to a program cache 32, a data cache 34, and a unified instruction/data memory 36. The program cache 32 and data cache 34 are connected to a level-2 memory 38. The memories 36 and 38 are connected to other components 40 of the system 10.

Also, a debug & emulation unit 42 is coupled between the program sequencer unit 14 and a Joint Test Action Group ("JTAG") port for debugging and emulating various operations of the system 10, in accordance with conventional JTAG techniques. Moreover, as shown in FIG. 2, one or more additional execution unit(s) 44 is/are optionally connected to the core unit 12, data cache 34, and memory 36.

For performing its various operations, the system 10 includes various other interconnections, components (e.g., memory management circuitry) and other details that, for clarity, are not expressly shown in FIG. 2. For example, the various address buses communicate suitable control signals, in addition to address signals. Likewise, the various data buses communicate suitable control signals, in addition to data signals.

The resource stall unit 16 is responsible for controlling an interlocked pipeline of the system 10. In response to information from an instruction execution bus, the resource stall unit 16 stores information about the status (or state) of various components of the core unit 12. In response to such status (or state) information, the resource stall unit 16 resolves conflicts and hazards in the pipeline by outputting suitable information to the program sequencer unit 14, AGU 18, DALU 20, and various other components of the system 10.

For example, in response to information from the resource stall unit 16, the program sequencer unit 14 reads and dispatches instructions in order of their programmed sequence. For reading instructions, the program sequencer unit 14 outputs suitable instruction addresses to the program cache 32 and memory 36 via a 32-bit instruction address bus. Similarly, in response to information from the resource stall unit 16 and AAUs 22, the address generator register file 26 outputs suitable instruction addresses to the program cache 32 and memory 36 via the instruction address bus, as for example in response to various types of change of flow ("COF") instructions that loop, interrupt, or otherwise branch or jump away from the program sequencer unit 14 sequence of instruction addresses. Such addresses (received via the instruction address bus from either the program sequencer unit 14 or the address generator register file 26) indicate suitable memory locations that store a sequence of instructions for execution by the system 10 ("addressed instructions").

Accordingly, in response to such addresses: (a) if the addresses are then-currently indexed in the program cache 32, the program cache 32 outputs the addressed instructions to the program sequencer unit 14 via a 128-bit instruction fetch bus; or (b) otherwise, the memory 36 outputs the addressed instructions to the program sequencer unit 14 via the instruction fetch bus. The program sequencer unit 14 receives and stores such instructions. In response to such fetched instructions, and in response to information received from the resource stall unit 16, the program sequencer unit 14 outputs (or dispatches) such instructions at suitable moments via an instruction execution bus to the resource stall unit 16, AAUs 22, BMU 22, ALUs 28, and execution unit(s) 44. The program sequencer unit 14 also includes circuitry for performing operations in support of exception processing.

The system 10 includes multiple units for executing instructions, namely the AAUs 22, BMU 24, ALUs 28, and execution unit(s) 44. In response to status (or state) information from the resource stall unit 16, such units execute one or more instructions, according to the various types of instructions (e.g., according to an instruction's particular type of operation). For example, using integer arithmetic, the AAUs 22 execute the address calculation operations of various instructions, such as COF instructions. The BMU 24 executes various instructions for shifting and masking bits in operands. The ALUs 28 execute various instructions for performing arithmetic and logical operations (e.g., numeric addition, subtraction, multiplication, and division) on operands. The execution unit(s) 44 execute various instructions for performing application-specific operations on operands in an accelerated manner.

At suitable moments, the AAUs 22 communicate with the address generator register file 26 (and vice versa) by receiving their source operand information from (and outputting their resultant destination operand information for storage to) the address generator register file 26. Likewise, at suitable moments, the ALUs 28 communicate with the DALU register file 30 (and vice versa) by receiving their source operand information from (and outputting their resultant destination operand information for storage to) the DALU register file 30.

Similarly, at suitable moments, the BMU 24, address generator register file 26, DALU register file 30, and execution unit(s) 44 communicate with the data cache 34 and/or memory 36 (and vice versa) by receiving their source operand information from (and outputting their resultant destination operand information for storage to) the data cache 34 and/or memory 36 via 64-bit operand1 and operand2 data buses. The addresses of such operand information are output from the address generator register file 26 via respective 32-bit operand1 and operand2 address buses, in response to information from the AAUs 22.

The program cache 32 and data cache 34 receive and store copies of selected information from the level-2 memory 38. In comparison to the level-2 memory 38, the program cache 32 and data cache 34 are relatively small memories with higher speed. The information in program cache 32 and data cache 34 is modifiable. Accordingly, at suitable moments, the system 10 copies such modified information from the program cache 32 and data cache 34 back to an associated entry in the level-2 memory 38 for storage, so that coherency of such modified information is maintained.

Similarly, via the other components 40 of the system 10, the level-2 memory 38 receives and stores copies of selected and load) may require several machine cycles of the system 10. In response to conflicts (e.g., read/write conflicts) between instructions, the resource stall unit 16 selectively introduces one or more delays (or stalls) in finishing a particular instruction's execution stage.

TABLE 1

Instructions Having Two Machine Cycles for Execution

| Instruction & Example Assembly Syntax | Example Operation (performed by the DALU 20) |
|---|---|
| Add compare select ("ACS") ACS2 Da.X, Db.Y, Dc, Dn | Performs four (4) operations of addition/subtraction between a selection of high portion ("HP") and low portion ("LP") contents of operand registers (Da, Db, Dc, Dn). Compares and finds the maximum of the results of the first two operations, and writes the maximum result to the HP of an operand register (Dn.H). Compares and finds the maximum of the results of the last two operations, and writes the maximum result to the LP of the operand register (Dn.L). If the first operation result is greater than the second operation result, bit 32 in the destination operand register (Dn[32]) is cleared; otherwise, the bit is set. If the third operation result is greater than the fourth operation result, bit 33 in the destination operand register (Dn[33]) is cleared; otherwise, the bit is set. The two HP and LP of the destination are limited to 16-bits. In case of overflow, the results are saturated to 16-bits maximum or minimum values. The extension byte of the result is undefined. |
| Multiply-accumulate signed fractions ("MAC") MAC Da, Db, Dn | Performs signed fractional multiplication of two 16-bit signed operands (Da.H/L and Db.H/L). Then adds or subtracts the product to or from a destination operand register (Dn). One operand is the HP or the LP of an operand register. The other operand is the HP or the LP of an operand register or an immediate 16-bit signed data. |
| Multiply signed fractions ("MPY") MPY Da, Db, Dn | Performs signed fractional multiplication of the high or low portions of two operand registers (Da, Db) and stores the product in a destination operand register (Dn). |
| Sum of absolute byte differences ("SAD") SAD4 Da, Db, Dn | Performs a 32-bit subtraction of source register Da from Db with the borrow disabled between bits 7 and 8, 15 and 16, and 23 and 24, so that the four bytes of each register are unsigned subtracted separately. The absolute value of each subtraction is added to the LP of the destination register Dn. The extension byte and the HP of the result are zero extended. | information from the memory 36. In comparison to the memory 36, the level-2 memory 38 is a relatively small memory with higher speed. The information in the level-2 memory 38 is modifiable, as for example when the system 10 copies modified information from the program cache 32 and data cache 34 back to an associated portion of the level-2 memory 38. Accordingly, at suitable moments, the system 10 copies such modified information from the level-2 memory 38 back to an associated entry in the memory 36 for storage, so that coherency of such modified information is maintained.

The system 10 achieves high performance by processing multiple instructions simultaneously at various ones of the AAUs 22, BMU 24, ALUs 28, and execution unit(s) 44. For example, the system 10 processes each instruction by a sequence of interlocked pipeline stages. Accordingly, the system 10 processes each stage of a particular instruction in parallel with various stages of other instructions.

In general, the system 10 operates with one machine cycle ("cycle") per stage (e.g., any stage's duration is a single machine cycle). However, some instructions (e.g., ACS, MAC, MPY and SAD, as described in Table 1) may require multiple machine cycles for execution (i.e., such instructions are executable in only multiple machine cycles of the system 10). Also, a memory access (e.g., instruction fetch or oper- In the illustrative embodiment, the system 10 processes an instruction in a sequence of ten interlocked pipeline stages, as described in Table 2, so that each instruction is processed in the same sequence of stages. During each pipeline stage, the system 10 prepares the instruction for its next stage. After the system 10 initiates an instruction's processing, the system 10 initiates the immediately subsequent instruction's processing at a later time (e.g., one machine cycle later). In that manner, the system 10 concurrently processes various stages of multiple instructions.

The multi-stage pipeline of the system 10 includes multiple execution stages. For example, in the illustrative embodiment as described in Table 2, the pipeline includes a first execution stage (E-stage) and a second execution stage (M-stage). In an alternative embodiment, the pipeline includes first and second execution stages, plus at least one additional execution stage. In such an alternative embodiment, the respective operations of the multiple execution stages are suitably established, according to the various objectives of the system 10, so that one or more of the E-stage or M-stage operations (which are described in Table 2) is/are performed instead (or additionally) by a suitable one or more of the multiple execution stages.

For example, in a first alternative embodiment, the additional execution stage(s) precede(s) the illustrative embodiment's first execution stage, so that the additional execution stage(s) would be immediately preceded by the C-stage in Table 2 and would perform operations accordingly. In a second alternative embodiment, the additional execution stage(s) follow(s) the illustrative embodiment's second execution stage, so that the additional execution stage(s) would be immediately followed by the W-stage in Table 2 and would perform operations accordingly. In a third alternative embodiment, one or more of the additional execution stage(s) precede(s) the illustrative embodiment's first execution stage, and one or more of the additional execution stage(s) follow(s) the illustrative embodiment's second execution stage, so that: (a) at least one of the additional execution stage(s) would be immediately preceded by the C-stage in Table 2 and would perform operations accordingly; and (b) at least one of the additional execution stage(s) would be immediately followed by the W-stage in Table 2 and would perform operations accordingly. Thus, similar to the illustrative embodiment, such alternative embodiments likewise benefit from the techniques discussed herein, and such techniques are likewise applicable to such alternative embodiments.

TABLE 2

Pipeline Stages Overview

| Pipeline Stage | Symbol | Description |
|---|---|---|
| Program Address | P-stage | During this machine cycle, via the instruction address bus, a suitable instruction address is output to the program cache 32 and memory 36. |
| Read Memory | R-stage | During this machine cycle, in response to the instruction address that was output during the P-stage, instructions are accessed in the program cache 32 and/or memory 36, and sixteen (16) sequential bytes of instructions are output via the instruction fetch bus from the program cache 32 and/or memory 36, according to whether the instruction address is then-currently indexed in the program cache 32. |
| Fetch | F-stage | During this machine cycle, via the instruction fetch bus, the program sequencer unit 14 receives and stores the sixteen (16) sequential bytes of instructions that were output during the R-stage. |
| VLES Dispatch | V-stage | During this machine cycle, the program sequencer unit 14 dispatches a variable length execution set ("VLES") instruction via the instruction execution bus to suitable execution units (i.e., the AAUs 22, BMU 24, ALUs 28, and execution unit(s) 44). If the instruction is a prefix instruction, which modifies the manner in which the system 10 processes subsequent instructions (e.g., if subsequent instructions are part of an alternative instruction set, which may be executed by execution unit(s) 44 to perform application-specific operations), the prefix instruction is decoded accordingly by the program sequencer unit 14 during this machine cycle. |
| Decode | D-stage | During this machine cycle, the dispatched instruction is decoded by the instruction's execution unit (i.e., the execution unit that will execute the instruction). |
| Address generation | A-stage | During this machine cycle, via the operand1 and operand2 address buses, the AGU 18 (from its address generator register file 26) outputs addresses of source operand information and destination operand information to the data cache 34 and memory 36. |
| Memory aCcess | C-stage | During this machine cycle, in response to the addresses that were output during the A-stage, source operand information is accessed in the data cache 34 and/or memory 36, and the source operand information is output via the operand1 and operand2 data buses from the data cache 34 and/or memory 36, according to whether the source operand information's address is then-currently indexed in the data cache 34. |
| Execution | E-stage | During this machine cycle, via the operand1 and operand2 data buses, the instruction's execution unit receives source operand information that was output |

TABLE 2-continued

Pipeline Stages Overview

| Pipeline Stage | Symbol | Description |
|---|---|---|
| | | during the C-stage. Also, during this machine cycle, the instruction's execution unit executes the instruction. |
| Mac | M-stage | During this machine cycle, if the instruction requires two machine cycles for execution, the instruction's execution unit finishes executing the instruction. Conversely, if the instruction requires only a single machine cycle for execution and is executed during the E-stage, the system 10 prepares the instruction for its W-stage, but otherwise performs no operation ("NOP") in response to the instruction during this machine cycle. |
| Write back | W-stage | During this machine cycle, via the operand1 and operand2 data buses, the instruction's execution unit outputs (or writes or stores) destination operand information to the data cache 34 and/or memory 36, according to whether the destination operand information's address is then-currently indexed in the data cache 34. |

Although illustrative embodiments have been shown and described, a wide range of modification, change and substitution is contemplated in the foregoing disclosure and, in some instances, some features of the embodiments may be employed without a corresponding use of other features. For example, although the discussion hereinabove variously refers to a signal's positive edge transition (having a first direction) and the signal's negative edge transition (having a second direction opposite from the first direction): (a) the positive edge transition has the same effective meaning as the signal having a "high" binary logic state of one; and (b) the negative edge transition has the same effective meaning as the signal having a "low" binary logic state of zero. In that manner, the discussion hereinabove applies to either: (a) a situation in which components of the circuitry 100 are responsive to the signal by being edge-sensitive to the signal (e.g., triggered in response to a predetermined edge of the signal); or (b) a situation in which components of the circuitry 100 are responsive to the signal by being level-sensitive to the signal (e.g., triggered in response to a predetermined level of the signal). Accordingly, it is appropriate that the appended claims be construed broadly and in a manner consistent with the scope of the embodiments disclosed herein.

What is claimed is:

1. Circuitry for preserving a logic state, comprising:
   first circuitry for:
      in response to a first transition of a clock signal, receiving an information signal having a logic state; and
      in response to a second transition of the clock signal, latching a logic state of a first signal that indicates the received information signal's logic state;
   second circuitry coupled to the first circuitry for:
      in response to the second transition of the clock signal, receiving the first signal from the first circuitry; and
      in response to a third transition of the clock signal, latching a logic state of a second signal that indicates the received first signal's logic state; and
   third circuitry coupled to the first and second circuitry for:
      during a first mode of operation, supplying power to the first and second circuitry; and
      during a second mode of operation, reducing power to the first circuitry, while supplying power to the second circuitry, so that the first signal's logic state is lost, while the second signal's logic state is preserved.

2. The circuitry of claim 1, wherein the first circuitry is coupled to a power supply during the first mode, and is decoupled from the power supply during the second mode.

3. The circuitry of claim 2, wherein the second circuitry is coupled to the power supply during the first and second modes.

4. The circuitry of claim 1, wherein the first transition has a first direction, the second transition has a second direction opposite from the first direction, and the third transition has the first direction.

5. The circuitry of claim 1, wherein the first transition occurs at a start of a particular cycle of the clock signal, and wherein the third transition occurs at an end of the particular cycle.

6. The circuitry of claim 5, wherein the second transition is between the first and third transitions.

7. The circuitry of claim 1, wherein fourth circuitry includes the first and second circuitry, and comprising fifth circuitry coupled to the third circuitry for:

determining whether the fourth circuitry is active, and outputting an activity signal in response thereto, wherein the third circuitry is for selecting between the first and second modes in response to the activity signal.

8. The circuitry of claim 7, wherein the third circuitry is for:

selecting the first mode during a period in response to the activity signal indicating that the fourth circuitry is active during the period; and selecting the second mode during the period in response to the activity signal indicating that the fourth circuitry is inactive during the period.

9. The circuitry of claim 7, wherein the fourth circuitry includes the fifth circuitry.

10. The circuitry of claim 1, wherein the first circuitry is responsive to the first and second transitions by being edge-sensitive.

11. The circuitry of claim 10, wherein the second circuitry is responsive to the second and third transitions by being edge-sensitive.

12. The circuitry of claim 1, wherein the first circuitry is responsive to the first and second transitions by being level-sensitive.

13. The circuitry of claim 12, wherein the second circuitry is responsive to the second and third transitions by being level-sensitive.

14. A method of preserving a logic state, comprising:

in response to a first transition of a clock signal, receiving an information signal having a logic state;

in response to a second transition of the clock signal, latching with first circuitry a logic state of a first signal that indicates the information signal's logic state;

in response to a third transition of the clock signal, latching with second circuitry a logic state of a second signal that indicates the first signal's logic state; and during a first mode of operation, supplying power to the first and second circuitry; and during a second mode of operation, reducing power to the first circuitry, while supplying power to the second circuitry, so that the first signal's logic state is lost, while the second signal's logic state is preserved.

15. The method of claim 14, wherein supplying power to the first circuitry comprises coupling the first circuitry to a power supply during the first mode, and wherein reducing power to the first circuitry comprises decoupling the first circuitry from the power supply during the second mode.

16. The method of claim 15, wherein supplying power to the second circuitry comprises coupling the second circuitry to the power supply during the first and second modes.

17. The method of claim 14, wherein the first transition has a first direction, the second transition has a second direction opposite from the first direction, and the third transition has the first direction.

18. The method of claim 14, wherein the first transition occurs at a start of a particular cycle of the clock signal, and wherein the third transition occurs at an end of the particular cycle.

19. The method of claim 18, wherein the second transition is between the first and third transitions.

20. The circuitry of claim 14, wherein fourth circuitry includes the first and second circuitry, and comprising:

determining whether the fourth circuitry is active, and outputting an activity signal in response thereto; and selecting between the first and second modes in response to the activity signal.

21. The circuitry of claim 20, wherein selecting comprises:

selecting the first mode during a period in response to the activity signal indicating that the fourth circuitry is active during the period; and selecting the second mode during the period in response to the activity signal indicating that the fourth circuitry is inactive during the period.

22. The method of claim 14, wherein latching with the first circuitry comprises latching with the first circuitry in response to the second transition by being edge-sensitive.

23. The method of claim 22, wherein latching with the second circuitry comprises latching with the second circuitry in response to the third transition by being edge-sensitive.

24. The method of claim 14, wherein latching with the first circuitry comprises latching with the first circuitry in response to the second transition by being level-sensitive.

25. The method of claim 24, wherein latching with the second circuitry comprises latching with the second circuitry in response to the third transition by being level-sensitive.

* * * * *